(12) United States Patent
Khlat et al.

(10) Patent No.: US 9,634,620 B2
(45) Date of Patent: Apr. 25, 2017

(54) ENVELOPE TRACKING WITH REDUCED CIRCUIT AREA AND POWER CONSUMPTION

(71) Applicant: RF Micro Devices, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/959,954

(22) Filed: Dec. 4, 2015

(65) Prior Publication Data

US 2016/0164551 A1 Jun. 9, 2016

Related U.S. Application Data

(60) Provisional application No. 62/087,989, filed on Dec. 5, 2014.

(51) Int. Cl.
| | |
|---|---|
| *H04B 1/04* | (2006.01) |
| *H03F 1/02* | (2006.01) |
| *H03F 3/19* | (2006.01) |
| *H03F 3/24* | (2006.01) |

(52) U.S. Cl.
CPC .............. *H03F 3/19* (2013.01); *H03F 1/0227* (2013.01); *H03F 3/245* (2013.01); *H03F 2200/102* (2013.01); *H03F 2200/451* (2013.01)

(58) Field of Classification Search
CPC .......... H03F 3/19; H03F 1/0227; H03F 3/245; H03F 2200/102; H03F 2200/451; H04B 2215/063; H04B 1/04; H04M 1/73; H04L 1/0044; H04L 1/0053
See application file for complete search history.

(56) References Cited

U.S. PATENT DOCUMENTS

| | | | | | |
|---|---|---|---|---|---|
| 6,138,042 | A | * | 10/2000 | Midya | ................... H03F 1/0227 323/222 |
| 8,744,382 | B2 | * | 6/2014 | Hou | ...................... H03F 1/0227 330/127 |
| 9,516,693 | B2 | * | 12/2016 | Khlat | ................. H04W 76/046 |
| 2009/0191826 | A1 | * | 7/2009 | Takinami | .............. H03F 1/0227 455/110 |

(Continued)

*Primary Examiner* — Andrew Wendell
(74) *Attorney, Agent, or Firm* — Withrow & Terranova, P.L.L.C.

(57) ABSTRACT

The present disclosure relates to envelope tracking with reduced circuit area and power consumption. In one embodiment, an envelope power converter includes a switching power converter configured to receive a supply voltage and provide an output based on a switching control signal. A holding inductor is coupled between the switching power converter and envelope power supply output node. An offset capacitor is coupled between the envelope power supply output node and control node. In response to a target envelope power supply output voltage, a control circuit is configured to generate the switching control signal and a control voltage to maintain envelope power supply signal at target voltage level. The control circuit is configured to generate switching control signal and control voltage such that supply voltage is provided by switching power converter to holding inductor and offset capacitor is charged to target level without changing voltage of envelope power supply signal.

20 Claims, 6 Drawing Sheets

(56) References Cited

U.S. PATENT DOCUMENTS

| | | | | |
|---|---|---|---|---|
| 2010/0156368 A1* | 6/2010 | Huynh | ............... | H02M 3/07 323/282 |
| 2012/0039098 A1* | 2/2012 | Berghegger | ...... | H02M 3/33507 363/21.13 |
| 2013/0193943 A1* | 8/2013 | Wilson | ............ | H02M 3/1582 323/284 |
| 2014/0312710 A1* | 10/2014 | Li | ............ | G05F 1/10 307/112 |
| 2016/0065137 A1* | 3/2016 | Khlat | ............ | H03F 3/19 455/114.3 |
| 2016/0088679 A1* | 3/2016 | Khlat | ............ | H03F 1/0222 455/127.1 |
| 2016/0099687 A1* | 4/2016 | Khlat | ............ | H03F 1/0227 455/127.3 |

\* cited by examiner

ENVELOPE TRACKING WITH REDUCED CIRCUIT AREA AND POWER CONSUMPTION

PRIORITY APPLICATION

This application claims the benefit of U.S. Provisional Patent Application Ser. No. 62/087,989, filed Dec. 5, 2014, the disclosure of which is incorporated herein by reference in its entirety.

FIELD OF THE DISCLOSURE

The present disclosure relates to envelope tracking systems for radio frequency (RF) amplifiers.

BACKGROUND

Many modern electronic devices include wireless communications circuitry. For example, an electronic device may include wireless local area network (WLAN) communications circuitry, cellular communications circuitry, or the like. While wireless communications circuitry allows electronic devices to communicate with one another, such functionality generally comes at the cost of additional energy consumption and thus reduced battery life. Often, wireless communications circuitry is the largest consumer of energy in an electronics device. As wireless communications protocols evolve to provide higher speeds, energy consumption of communications circuitry often increases to meet the higher demands of such protocols.

Consumer demand for longer battery life from electronic devices has resulted in the development of many power-saving techniques for wireless communications. One way to conserve power consumed via wireless communications is through the use of envelope tracking. Envelope tracking involves modulating a supply voltage provided to an amplifier based on the instantaneous magnitude (i.e., the envelope) of an RF input signal provided to the amplifier. FIG. 1 illustrates the basic concept of envelope tracking. Specifically, FIG. 1 shows an amplitude-modulated RF signal 10. Conventionally, a constant supply voltage at a level sufficient to ensure adequate headroom across the entire amplitude range of the RF signal 10 would be supplied to the amplifier, as shown by line 12. This results in a significant amount of wasted energy, and thus poor efficiency, when the amplitude of the RF signal 10 is below the maximum level, as illustrated by line 14. Accordingly, an envelope power supply signal tracks the amplitude of the RF signal 10, as illustrated by line 16, and therefore increases efficiency by preventing the unnecessary expenditure of power when the amplitude of the RF signal 10 is below the maximum level.

To employ envelope tracking as described in FIG. 1, electronic devices conventionally include envelope tracking circuitry configured to generate the envelope power supply signal illustrated by line 16. Due to the fact that the gain of an RF amplifier is dependent on both the input power of an RF input signal and a supply voltage provided thereto, such circuitry may be calibrated by populating a look-up table (LUT) that stores multiple envelope tracking related voltages corresponding to various voltages of the RF signal 10 that are used to avoid distortion in the output of the amplifier. In this manner, the envelope tracking circuitry can provide the envelope power supply signal based on values stored in the LUT such that the gain of the RF amplifier remains substantially constant regardless of the input power provided to the RF amplifier. The calibration of the envelope tracking circuitry plays an important role in implementing envelope tracking for an RF amplifier. However, as the demand for increasingly smaller electronic devices, such as wearable devices, continues to rise, the area and power consumption available for such envelope tracking circuitry continues to fall. These design constraints may interfere with the ability of the envelope tracking circuitry to be properly calibrated.

In light of the above, there is a need for envelope tracking circuitry with reduced circuit area and power consumption that is capable of calibration to avoid distortion.

SUMMARY

The present disclosure relates to envelope tracking circuitry with reduced circuit area and power consumption. In one embodiment, an envelope power converter includes a switching power converter configured to receive a supply voltage and provide an output voltage based on a switching control signal. A holding inductor is coupled between the switching power converter and an envelope power supply output node, and an offset capacitor is coupled between the envelope power supply output node and a control node. A control circuit is coupled to the switching power converter and the control node. In response to a target envelope power supply output voltage, the control circuit is configured to generate the switching control signal and a control voltage at the control node so as to maintain a voltage of an envelope power supply signal at the envelope power supply output node at a target envelope power supply output voltage. The control circuit is also configured to generate the switching control signal and the control voltage in response to a boost signal such that the supply voltage is provided by the switching power converter directly to the holding inductor and the offset capacitor is charged to a target capacitor voltage level without changing the voltage of the envelope power supply signal.

Operating the envelope power converter in this manner enables the envelope power converter to maintain the envelope power supply signal at voltages higher than the supply voltage for extended periods of time using only a step-down switching power converter (e.g., a buck converter). This may be particularly useful, for example, during a calibration process of the envelope power converter. A step-up switching power converter is therefore not required in the envelope power converter. Because step-up switching power converters often require large components that consume significant power, the envelope power converter enables envelope tracking with reduced circuit area and power consumption compared to conventional devices. The above-mentioned operation of the envelope power converter also avoids the need for special design of the holding inductor, the offset capacitor, and the control circuit for calibration, which increases the performance of the envelope power converter during normal operation.

In another embodiment, a radio frequency (RF) transmitter includes a modulator circuit configured to receive a baseband signal and provide an RF input signal. The RF transmitter further comprises an amplifier configured to receive and amplify the RF input signal using an envelope power supply signal to provide an RF output signal. The RF transmitter further comprises a front end circuit configured to receive the RF output signal and provide the RF output signal to an antenna for transmission. The RF transmitter further comprises an envelope power converter. The envelope power converter comprises a switching power converter configured to receive a supply voltage and provide an output voltage based on a switching control signal. The envelope power converter further comprises a holding inductor coupled between the switching power converter and an envelope power supply output node. The envelope power converter further comprises an offset capacitor coupled between the envelope power supply output node and a control node. The envelope power converter further comprises a control circuit coupled to the switching power converter and the control node. In response to a target envelope power supply output voltage, the control circuit is configured to generate the switching control signal and a control voltage at the control node so as to maintain a voltage of the envelope power supply signal at the envelope power supply output node at the target envelope power supply output voltage. In response to a boost signal, the control circuit is further configured to generate the switching control signal and the control voltage such that the supply voltage is provided by the switching power converter directly to the holding inductor and the offset capacitor is charged to a target capacitor voltage level without changing the voltage of the envelope power supply signal. The RF transmitter further comprises an envelope tracking circuit coupled to the envelope power converter and configured to provide the target envelope power supply output voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
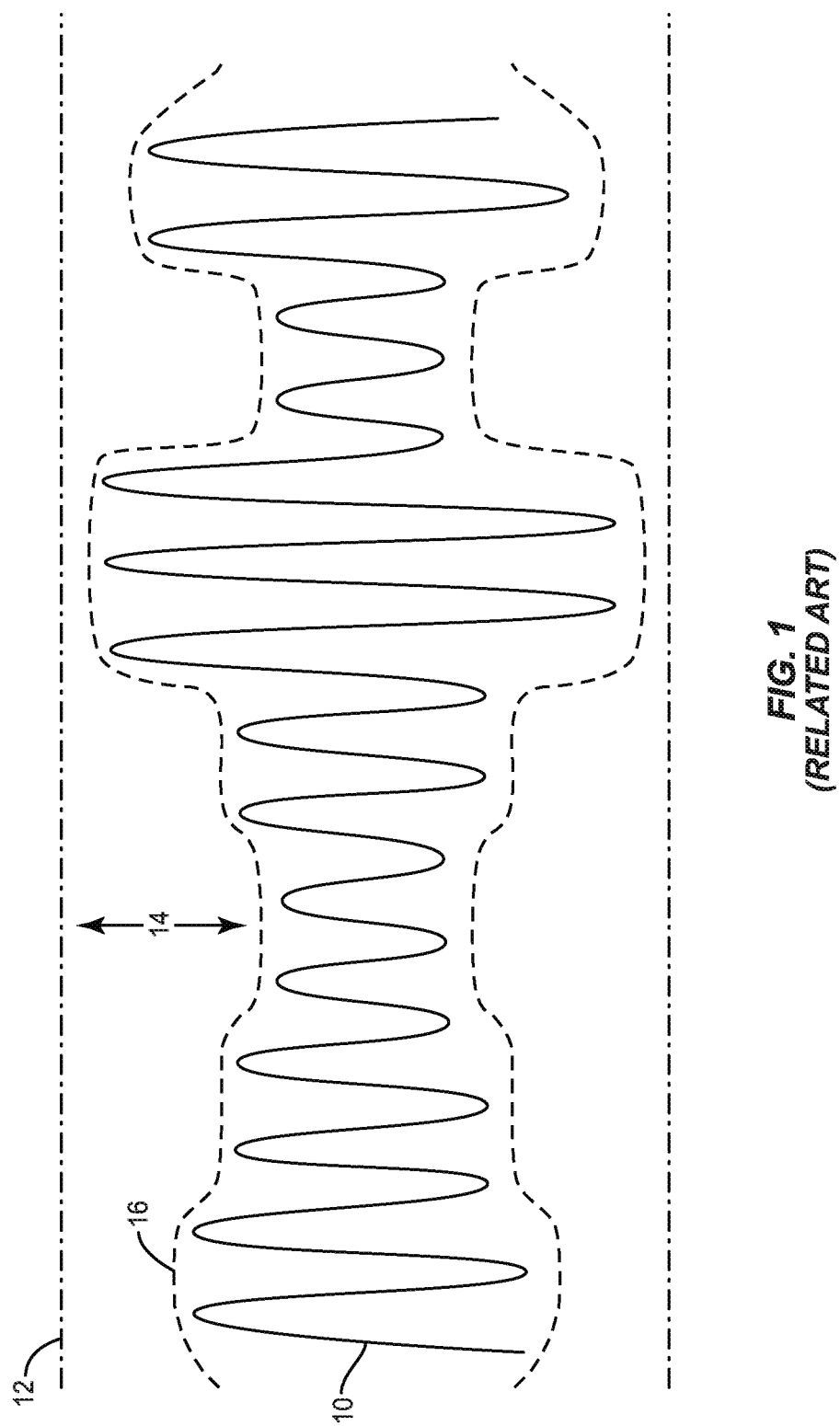
FIG. 1 is a plot illustrating conventional envelope tracking techniques.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to envelope tracking circuitry with reduced circuit area and power consumption. In one embodiment, an envelope power converter includes a switching power converter configured to receive a supply voltage and provide an output voltage based on a switching control signal. A holding inductor is coupled between the switching power converter and an envelope power supply output node, and an offset capacitor is coupled between the envelope power supply output node and a control node. A control circuit is coupled to the switching power converter and the control node. In response to a target envelope power supply output voltage, the control circuit is configured to generate the switching control signal and a control voltage at the control node so as to maintain a voltage of an envelope power supply signal at the envelope power supply output node at a target envelope power supply output voltage. The control circuit is also configured to generate the switching control signal and the control voltage in response to a boost signal such that the supply voltage is provided by the switching power converter directly to the holding inductor and the offset capacitor is charged to a target capacitor voltage level without changing the voltage of the envelope power supply signal.

Operating the envelope power converter in this manner enables the envelope power converter to maintain the envelope power supply signal at voltages higher than the supply voltage for extended periods of time using only a step-down switching power converter (e.g., a buck converter). This may be particularly useful, for example, during a calibration process of the envelope power converter. A step-up switching power converter is therefore not required in the envelope power converter. Because step-up switching power converters often require large components that consume significant power, the envelope power converter enables envelope tracking with reduced circuit area and power consumption compared to conventional devices. The above-mentioned operation of the envelope power converter also avoids the need for special design of the holding inductor, the offset capacitor, and the control circuit for calibration, which increases the performance of the envelope power converter during normal operation.

Figure 2:
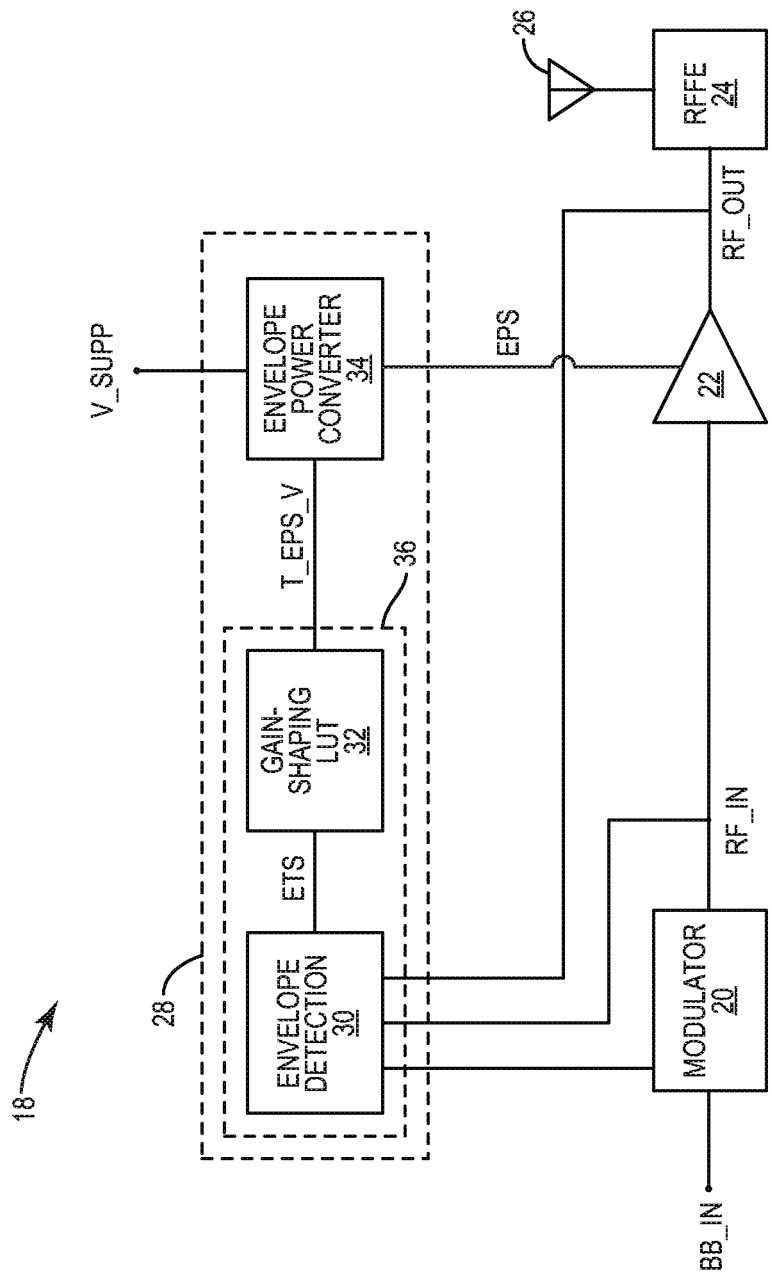
FIG. 2 is a diagram illustrating an exemplary radio frequency (RF) transmitter according to one embodiment of the present disclosure.

Before discussing details of achieving envelope tracking with reduced circuit area and power consumption, a diagram of a radio frequency (RF) transmitter 18 is first described in FIG. 2 according to one embodiment of the present disclosure. The RF transmitter 18 includes a modulator circuit 20 configured to receive a baseband input signal BB_IN and provide an RF input signal RF_IN to an input of an RF amplifier 22. The RF amplifier 22 amplifies the RF input signal RF_IN using an envelope power supply signal EPS to provide an RF output signal RF_OUT to an RF front end circuit 24. The RF front end circuit 24 may appropriately filter the RF output signal RF_OUT and provide the RF output signal RF_OUT to an antenna 26, which may be one of a number of antennas (not shown for purposes of clarity).

An envelope power supply circuit 28 is coupled to one or more of the modulator circuit 20, the input of the RF amplifier 22, and the output of the RF amplifier 22. The envelope power supply circuit 28 includes an envelope detection circuit 30, a gain-shaping look-up table (LUT) 32, and an envelope power converter 34. Together, the envelope detection circuit 30 and the gain-shaping LUT 32 are referred to as an envelope tracking circuit 36. The envelope detection circuit 30 may receive one or more of an envelope signal from the modulator circuit 20 (e.g., an in-phase component and a quadrature component of the baseband input signal BB_IN), the RF input signal RF_IN, and the RF output signal RF_OUT, and provide an envelope tracking signal ETS to the gain-shaping LUT 32. The gain-shaping LUT 32 receives the envelope tracking signal ETS and provides a target envelope power supply output voltage T_EPS_V to the envelope power converter 34 based thereon. The envelope power converter 34 receives the target envelope power supply output voltage T_EPS_V and a supply voltage V_SUPP and provides the envelope power supply signal EPS based thereon.

During operation of the envelope power supply circuit 28, the gain-shaping LUT 32 provides the target envelope power supply output voltage T_EPS_V such that envelope power supply signal EPS causes the gain of the RF amplifier 22 to remain substantially constant regardless of the input power provided to the RF amplifier 22. As will be appreciated by those of ordinary skill in the art, the gain of the RF amplifier 22 is dependent on both the input power of the RF input signal RF_IN and the envelope power supply signal EPS. In other words, changing the input power of the RF input signal RF_IN or the envelope power supply signal EPS provided to the RF amplifier 22 may also change the gain of the RF amplifier 22. This may in turn cause amplitude modulation (AM) to AM distortion in the RF output signal RF_OUT.

One way to avoid this AM to AM distortion is by providing the envelope power supply signal EPS according to an isogain contour of the RF amplifier 22. An isogain contour defines a relationship between input power and supply voltage for an amplifier that will produce a substantially constant gain. Providing a supply voltage to an amplifier according to an isogain contour allows the gain of the amplifier to remain substantially constant over most if not all of the range of input power provided to the amplifier, thereby significantly reducing or eliminating AM to AM distortion in an RF output signal due to envelope power supply modulation. In this embodiment, values related to the input power and supply voltage of the RF amplifier 22 are stored in the gain-shaping LUT 32 and accessed by the envelope power converter 34 during operation of the RF transmitter 18 in order to provide the envelope power supply signal EPS according to an isogain contour.

Figure 3:
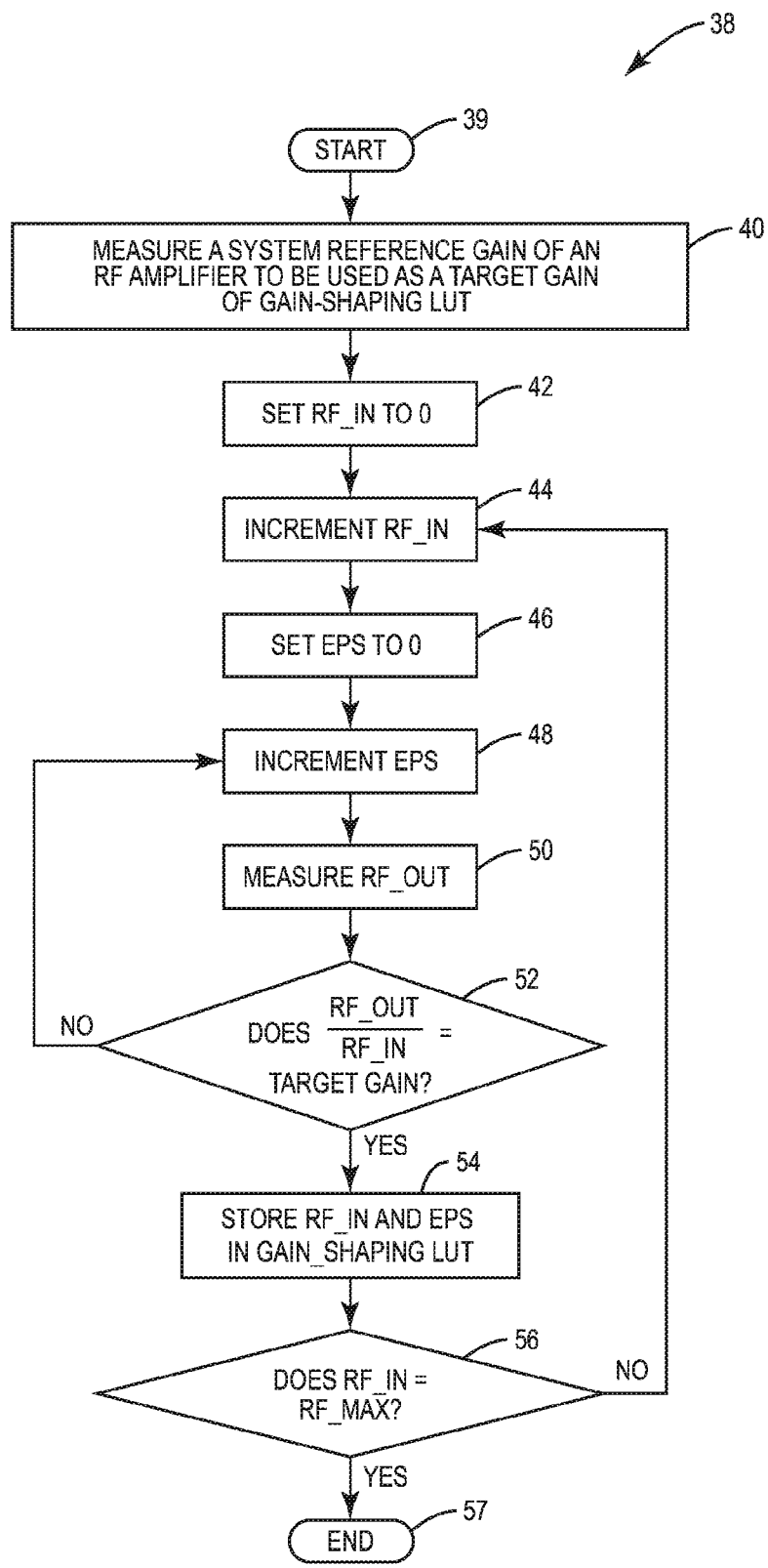
FIG. 3 is a flowchart illustrating an exemplary process of performing an isogain contour calibration sequence on an RF amplifier of the RF transmitter in FIG. 2.

FIG. 3 is a flowchart illustrating an exemplary process 38 of calibrating isogain contour values stored in the gain-shaping LUT 32 during an isogain calibration sequence of the RF transmitter 18. Once the process 38 starts (block 39), the process 38 includes measuring a system reference gain of the RF amplifier 22 to be used as a target gain for calibrating the envelope power supply signal EPS value corresponding to each RF input signal RF_IN value stored in the gain-shaping LUT 32 (block 40). Using the target gain calculated in block 40, the process 38 includes setting the RF input signal RF_IN to zero volts (0 V) (block 42). The process 38 also includes incrementing the RF input signal RF_IN by a pre-determined voltage according to the circuit characteristics of the RF transmitter 18 (block 44). Further, the process 38 includes setting the envelope power supply signal EPS to 0 V (block 46). Next, the process 38 includes incrementing the envelope power supply signal EPS by a pre-determined voltage (block 48).

Once the envelope power supply signal EPS is incremented in block 48, the process 38 includes measuring the RF output signal RF_OUT generated using the envelope power supply signal EPS at the current voltage (block 50). In response to measuring the RF output signal RF_OUT, the process 38 determines if the gain of the RF amplifier 22 (i.e., RF_OUT/RF_IN) is equal to the target gain (block 52). If the measured gain in block 52 is not equal to the target gain, the process 38 returns to block 48 and increments the envelope power supply signal EPS so as to measure the gain of the RF amplifier 22 using an updated value of the envelope power supply signal EPS. However, if the measured gain is equal to the target gain, the process 38 stores the envelope power supply signal EPS voltage and the corresponding RF input signal RF_IN voltage in the gain-shaping LUT 32 (block 54). The process 38 then determines if the RF input signal RF_IN has a maximum input power RF_MAX (block 56). If the RF input signal RF_IN has the maximum input power RF_MAX, the process 38 ends (block 57), as this means that the process 38 has calibrated each envelope power supply signal EPS voltage in the gain-shaping LUT 32 corresponding to every input power of the RF input signal RF_IN. Conversely, if the RF input signal RF_IN does not equal the maximum input power RF_MAX, the process 38 returns to block 44 and increments the RF input signal RF_IN to the next input power to be calibrated. As a result of performing the process 38 for isogain contour calibration, the gain-shaping LUT 32 is calibrated to provide the envelope power supply signal EPS such that the RF amplifier 22 can provide an approximately constant gain across various input power levels of the RF input signal RF_IN.

To measure the gain of the RF amplifier 22 in block 52 of the process 38 in FIG. 3, the envelope power supply signal EPS should be maintained at a particular voltage level for a predetermined minimum testing period according to the timing requirements of the envelope power converter 34. For example, the envelope power supply signal EPS in this embodiment should be maintained at a particular voltage between about 1.0 micro-seconds ($\mu$s) and 5.0 $\mu$s to ensure that the gain of the RF amplifier 22 is accurately measured.

Such circuitry may need to maintain the envelope power supply signal EPS at voltages less than or equal to the supply voltage V_SUPP, as well as voltages greater than the supply voltage V_SUPP. To maintain the envelope power supply signal EPS at voltages greater than the supply voltage V_SUPP, a step-up power converter (e.g., a boost converter) has conventionally been used. However, using a step-up power converter generally increases both circuit area and power consumption of an envelope power converter. In devices with design constraints that limit the circuit area and power consumption of the envelope power converter (e.g., wearable devices), using step-up converter circuitry may not be practical.

Figure 4:
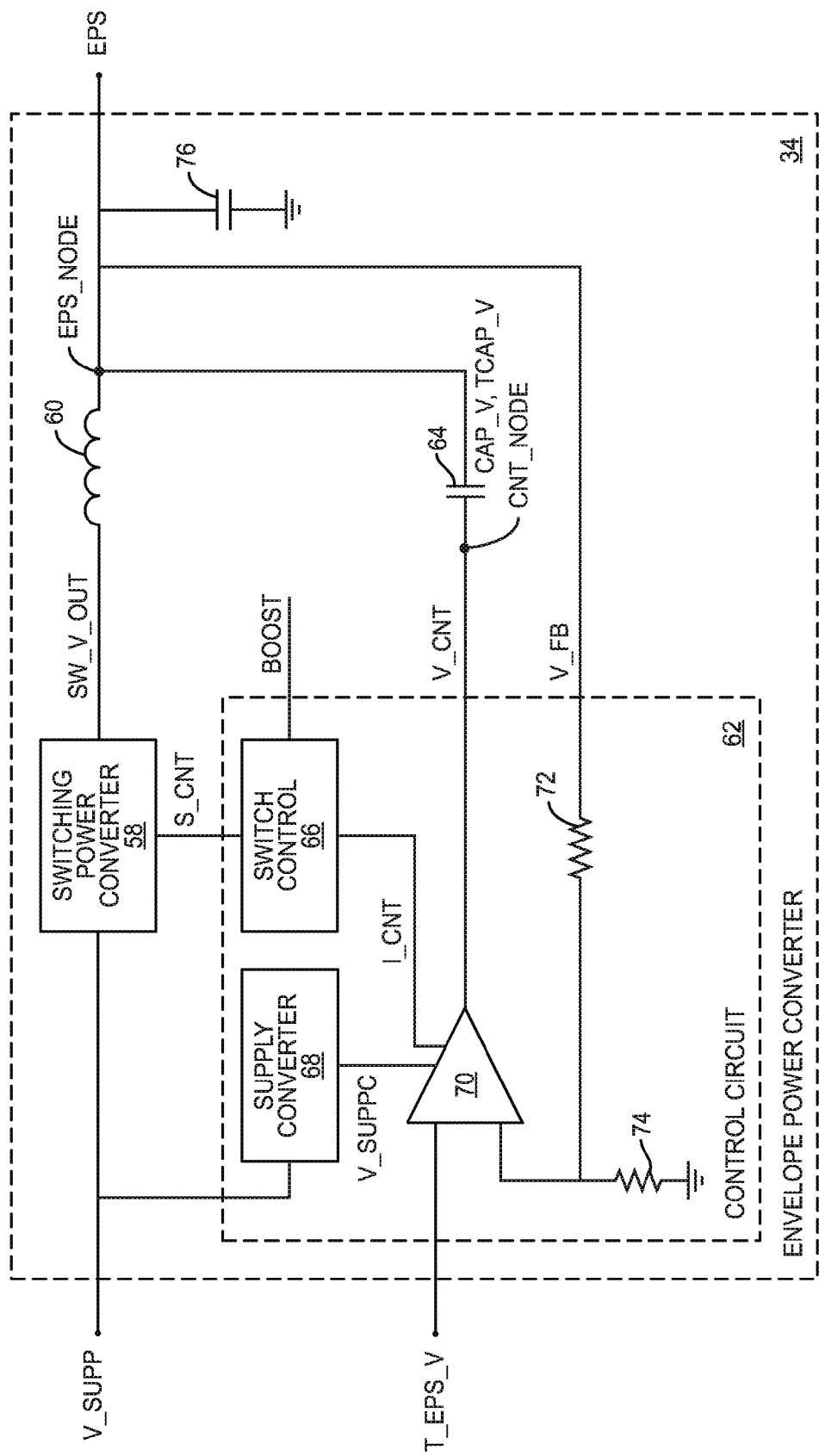
FIG. 4 is a diagram illustrating an exemplary envelope power converter configured to employ a boost signal according to one embodiment of the present disclosure.

Accordingly, FIG. 4 is a diagram of the envelope power converter 34 according to one embodiment of the present disclosure. The envelope power converter 34 in FIG. 4 is configured to maintain the envelope power supply signal EPS at a voltage above the supply voltage V_SUPP for extended periods of time while maintaining a small circuit area and reducing power consumption. In particular, the envelope power converter 34 is configured to maintain the envelope power supply signal EPS at voltages greater than the supply voltage V_SUPP without the use of a step-up power converter. This may be particularly useful, for example, during a LUT isogain contour calibration process such as the one described above in FIG. 3.

The envelope power converter 34 in FIG. 4 includes a switching power converter 58 configured to receive the supply voltage V_SUPP and provide a stepped-down converter output voltage SW_V_OUT to a holding inductor 60 based on a switching control signal S_CNT provided from a control circuit 62. In other words, the switching power converter 58 in this embodiment is a step-down switching power converter (e.g., a buck power converter). The holding inductor 60 is coupled between the switching power converter 58 and an envelope power supply output node EPS_NODE on which the envelope power supply signal EPS is provided. Further, an offset capacitor 64 is coupled between the envelope power supply output node EPS_NODE and a control node CNT_NODE.

The control circuit 62 is coupled to the switching power converter 58 and the control node CNT_NODE. The control circuit 62 is configured to operate in a normal mode of operation and a boost mode of operation. In a normal mode of operation, the control circuit 62 maintains the envelope power supply signal EPS at a voltage dictated by the target envelope power supply output voltage T_EPS_V. In particular, the control circuit 62 generates the switching control signal S_CNT and a control voltage V_CNT (provided at the control node CNT_NODE) in response to the target envelope power supply output voltage T_EPS_V so as to maintain the envelope power supply signal EPS at the target envelope power supply output voltage T_EPS_V.

In a boost mode of operation, the control circuit 62 is configured to maintain the envelope power supply signal EPS at a voltage greater than the supply voltage V_SUPP for an extended period of time. In one embodiment, the extended period of time corresponds with the predetermined minimum testing period discussed above with respect to FIG. 3. As discussed above, the ability of the envelope power converter 34 to provide voltages above the supply voltage V_SUPP is limited due to the fact that the switching power converter 58 is a step-down only power converter. Accordingly, the control circuit 62 is also configured to generate the switching control signal S_CNT and the control voltage V_CNT in response to a boost signal BOOST, wherein the boost signal BOOST is not provided to the control circuit 62 in the normal mode of operation. In response to the boost signal BOOST, the switching control signal S_CNT and the control voltage V_CNT are generated such that the supply voltage V_SUPP is provided by the switching power converter 58 directly to the holding inductor 60, a capacitor voltage CAP_V of the offset capacitor 64 is charged to a target capacitor voltage level TCAP_V, and the voltage of the envelope power supply signal EPS is not changed. That is, the voltage of the envelope power supply signal EPS is maintained at the target envelope power supply output voltage T_EPS_V while providing additional current to the offset capacitor 64 via the holding inductor 60 in order to store charge in the offset capacitor 64 that is later used to sustain a voltage of the envelope power supply signal EPS for an extended period of time, as discussed below.

Forcing the voltage across the holding inductor 60 to the supply voltage V_SUPP while holding the voltage of the envelope power supply signal EPS significantly lower than the supply voltage V_SUPP allows for the accumulation of significant charge in the offset capacitor 64. Conventionally, the stepped-down converter output voltage SW_V_OUT was only changed in response to the target envelope power supply output voltage T_EPS_V, as discussed below. That is, a conventional control scheme for an envelope power converter did not contemplate independent control of the stepped-down converter output voltage SW_V_OUT and the control voltage V_CNT. This limited the ability of the envelope power converter 34 to accumulate charge in the offset capacitor 64, thereby resulting in the need for a larger capacitance of the offset capacitor 64 in order to provide envelope power supply signal EPS voltages above the supply voltage V_SUPP for extended periods of time. Such an increase in the capacitance of the offset capacitor 64 degraded performance during the normal mode of operation of the envelope power converter 34. Operating the envelope power converter 34 in the boost mode of operation essentially allows the calibration of the envelope power converter 34 to be neglected in the design of the components, which results in increased performance of the envelope power converter 34 during the normal mode of operation.

The envelope power supply signal EPS is maintained at a voltage above the supply voltage V_SUPP by energy stored in the holding inductor 60 and the offset capacitor 64. In particular, the boost signal BOOST is provided to ensure that the offset capacitor 64 is sufficiently charged (i.e., the capacitor voltage CAP_V of the offset capacitor 64 is charged to the target capacitor voltage level TCAP_V) to maintain the envelope power supply signal EPS at the target envelope power supply output voltage T_EPS_V above the supply voltage V_SUPP for a desired amount of time. To ensure that capacitor voltage CAP_V of the offset capacitor 64 charges to the target capacitor voltage level TCAP_V, the boost signal BOOST is provided to the control circuit 62 for a predetermined charging period before a change in the target envelope power supply output voltage T_EPS_V. As a result, the offset capacitor 64 has enough time to charge the capacitor voltage CAP_V to the target capacitor voltage level TCAP_V, which is sufficient to allow the envelope power converter 34 to maintain the envelope power supply signal EPS above the supply voltage V_SUPP for an extended period of time.

To maintain the envelope power supply signal EPS in both the normal and boost modes of operation, the control circuit 62 in this embodiment includes a switching control circuit 66, a supply voltage converter 68, and a control amplifier 70. The switching control circuit 66 is configured to receive the boost signal BOOST and a control current I_CNT from the control amplifier 70 and provide the switching control signal S_CNT. The supply voltage converter 68 is configured to receive the supply voltage V_SUPP and provide a converted supply voltage V_SUPPC to the control amplifier 70. The control amplifier 70 receives the target envelope power supply output voltage T_EPS_V from the envelope tracking circuit 36 in FIG. 2, and in particular, the gain-shaping LUT 32. Further, the control amplifier 70 receives a feedback voltage V_FB via a voltage divider formed from an isolation resistance 72 and a divider resistance 74 from an output of the envelope power converter 34. As will be appreciated by those of ordinary skill in the art, the control amplifier 70 may be an operational amplifier configured to equalize the target envelope power supply output voltage T_EPS_V and the feedback voltage V_FB by changing the control voltage V_CNT and the control current I_CNT provided therefrom. The control current I_CNT from the control amplifier 70 (or a mirrored version thereof) is delivered to the switching control circuit 66, which generates the switching control signal S_CNT based thereon. The control voltage V_CNT is provided from the control amplifier 70 to the offset capacitor 64. A smoothing capacitor 76 is included in the envelope power converter 34 to reduce ripple in the envelope power supply signal EPS.

Figure 5:
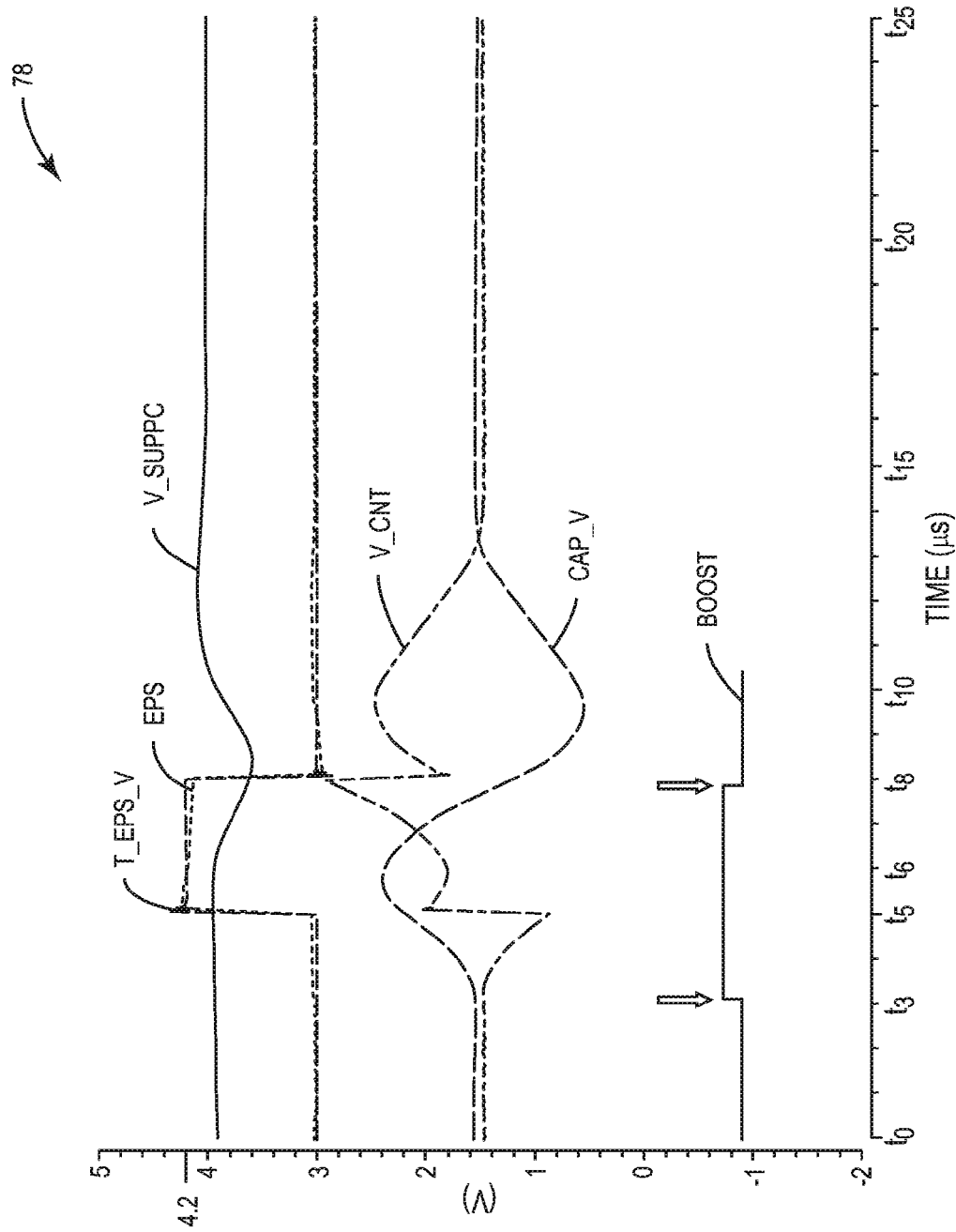
FIG. 5 is a graph illustrating signals generated by the envelope power converter in FIG. 4 in response to providing the boost signal to a control circuit according to one embodiment of the present disclosure.

As a non-limiting example of the boost mode of operation, FIG. 5 provides a graph 78 illustrating signals generated by the envelope power converter 34 according to one embodiment of the present disclosure. In this example, the supply voltage V_SUPP is between 3.6 V and 3.8 V, a maximum envelope power supply voltage level is between about 4.2 V and 4.6 V, and the target capacitor voltage level TCAP_V is between about 1.0 V and 3.0 V. Further, the predetermined charging period is between about 0.5 µs and 3.0 µs, and the predetermined minimum testing period is between about 1.0 µs and 5.0 µs. The holding inductor 60 has an inductance between about 1.0 µH and 4.0 µH, and the offset capacitor 64 has a capacitance between 220 nF and 4700 nF. Those skilled in the art will readily appreciate that the principles of the present disclosure apply equally to any values of the aforementioned parameters.

At time t0 in FIG. 5, the boost signal BOOST is not provided to the control circuit 62 (e.g., the boost signal BOOST has a non-active state), meaning that the envelope power converter 34 is operating in the normal mode of operation. At this time, the target envelope power supply output voltage T_EPS_V is set to 3.0 V such that the control circuit 62 maintains the envelope power supply signal EPS at the same voltage (i.e., 3.0 V). This results in the offset capacitor 64 being charged to the capacitor voltage CAP_V of 1.55 V and the control voltage V_CNT provided by the control amplifier 70 being charged to 1.5 V. The target envelope power supply output voltage T_EPS_V is set to 3.0 V so as to set the capacitor voltage CAP_V and the control voltage V_CNT to the desired values, and may be adjusted as desired subject to design constraints. At approximately time t3, the boost signal BOOST is provided to the switching control circuit 66 (e.g., the boost signal BOOST has an active state), thus placing the envelope power converter 34 in the boost mode of operation. In response to the boost signal BOOST, the switching power converter 58 provides the supply voltage V_SUPP as the stepped-down converter output voltage SW_V_OUT, for example, by directly connecting the supply voltage V_SUPP to the holding inductor 60. This voltage is provided across the holding inductor 60, where it is detected via the feedback voltage V_FB by the control amplifier 70.

The control amplifier 70, in an attempt to equalize the increasing feedback voltage V_FB with the target envelope power supply output voltage T_EPS_V (which does not change at time t3), reduces the control voltage V_CNT at the control node CNT_NODE. The resulting voltage across the offset capacitor 64 causes the offset capacitor 64 to sink current and accumulate charge such that the capacitor voltage CAP_V across the offset capacitor 64 gradually increases to reach the target capacitor voltage TCAP_V, and the voltage of the envelope power supply signal EPS does not change. Approximately 1.8 µs (e.g., the predetermined charging period in this example) following activation of the boost signal BOOST at time t5, the target envelope power supply output voltage T_EPS_V increases to 4.2 V, which may be the maximum envelope power supply voltage level. Due to the mismatch between the target envelope power supply output voltage T_EPS_V and the feedback voltage V_FB provided to the control amplifier 70, the control amplifier 70 rapidly increases the control voltage V_CNT. This in turn increases the voltage at the envelope power supply output node EPS_NODE to the target envelope power supply output voltage T_EPS_V (since the voltage of the envelope power supply signal EPS is equal to the sum of the control voltage V_CNT and the capacitor voltage CAP_V across the offset capacitor 64). However, the control voltage V_CNT provided by the control amplifier 70 is limited due to the fact that the control amplifier 70 is designed for maximum efficiency and minimal size.

Accordingly, the envelope power converter 34 relies upon the discharge of the offset capacitor 64 in order to maintain the envelope power supply signal EPS at the target envelope power supply output voltage T_EPS_V. Without the pre-charging of the offset capacitor 64 provided in the boost mode of operation, the charge on the offset capacitor 64 would be insufficient to maintain the envelope power supply signal EPS at the target envelope power supply output voltage T_EPS_V for the desired amount of time, which may interfere with the ability of the envelope power converter 34 to perform isogain contour calibration, as discussed above.

The capacitance of the offset capacitor 64 dictates the discharge rate thereof. Due to design constraints dictating the speed at which the voltage of the envelope power supply signal EPS needs to change (e.g., due to a desired modulation frequency of the envelope power supply signal EPS), the capacitance of the offset capacitor 64 must generally be kept low. For example, in one embodiment, the capacitance of the offset capacitor 64 may be around 470 nF. Accordingly, the boost mode of operation may be required to ensure that adequate charge is accumulated on the offset capacitor 64 in order to maintain the voltage of the envelope power supply signal EPS at a desired level for the predetermined minimum testing period of 3.0 µs. At time t8 (i.e., the predetermined minimum testing period of 3.0 µs following the target envelope power supply output voltage T_EPS_V increasing to 4.2 V), the target envelope power supply output voltage T_EPS_V is reduced back to 3.0V, and the boost signal BOOST is no longer provided to the control circuit 62 (e.g., the boost signal BOOST transitions to a non-active state). This causes the envelope power converter 34 to operate in the normal mode of operation. By using the boost signal BOOST in conjunction with the offset capacitor 64 in this manner, the envelope power converter 34 can provide the envelope power supply signal EPS with a voltage greater than the supply voltage V_SUPP for isogain contour calibration without employing additional boost switch circuitry or special design of the various components in the envelope power converter 34 for calibration. Thus, the envelope power converter 34 may be used to achieve envelope tracking with reduced circuit area and power consumption in the devices such as the RF transmitter 18 in FIG. 2.

While the boost mode of operation in the embodiment discussed above is initiated via the boost signal BOOST, the boost mode of operation may be initiated in any manner without departing from the principles of the present disclosure. For example, the boost mode of operation may be initiated by the switching control circuit 66 internally, or by any other suitable mechanism. Using the boost mode of operation allows the switching power converter 58 to be a step-down only power converter, thereby reducing the size and increasing the efficiency of the envelope power converter 34. Further, using the boost mode of operation allows the holding inductor 60, the offset capacitor 64, and the control amplifier 70 to be designed for maximum efficiency during the normal mode of operation, which may further improve the performance of the envelope power converter 34.

Figure 6:
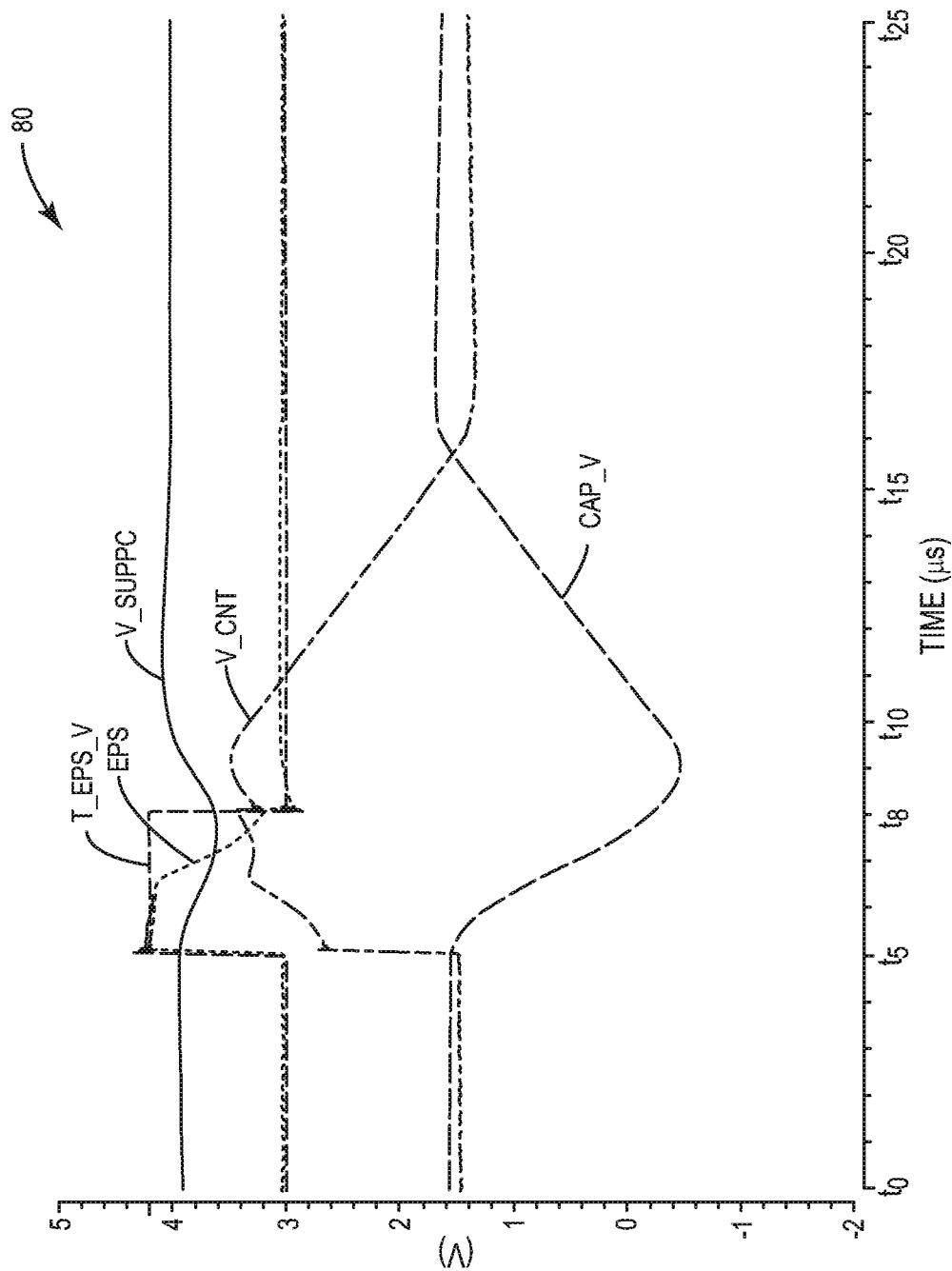
FIG. 6 is a graph illustrating exemplary signals generated by the envelope power converter in FIG. 4 in response to not providing the boost signal to the control circuit.

To further illustrate the benefits of the embodiments disclosed herein, FIG. 6 provides a graph 80 illustrating signals generated by the envelope power converter 34 without use of the boost mode of operation. In this example, the supply voltage V_SUPP, the maximum envelope power supply voltage level, the target capacitor voltage level TCAP_V, the predetermined charging period, and the predetermined minimum testing period are similar to the values described in FIG. 5. The holding inductor 60 inductance and the offset capacitor 64 capacitance are also similar to the values describe in FIG. 5.

At time t0 in FIG. 6, the envelope power converter 34 is operating in the normal mode of operation. At this time, the target envelope power supply output voltage T_EPS_V is set to 3.0 V such that the control circuit 62 maintains the envelope power supply signal EPS at the same voltage (i.e., 3.0 V). This results in the offset capacitor 64 being charged to a capacitor voltage CAP_V of 1.55 V and the control voltage V_CNT provided by the control amplifier 70 being charged to 1.5 V. At approximately time t5, the target envelope power supply output voltage T_EPS_V increases to 4.2 V. Due to the mismatch between the target envelope power supply output voltage T_EPS_V and the feedback voltage V_FB provided to the control amplifier 70, the control amplifier 70 rapidly increases the control voltage V_CNT. This in turn increases the voltage at the envelope power supply output node EPS_NODE to the target envelope power supply output voltage T_EPS_V (since the voltage of the envelope power supply signal EPS is equal to the sum of the control voltage V_CNT and the capacitor voltage CAP_V across the offset capacitor 64). However, the control voltage V_CNT provided by the control amplifier 70 is limited due to the fact that the control amplifier 70 is designed for maximum efficiency during the normal mode of operation and minimal size.

The offset capacitor 64 begins to discharge shortly thereafter. The discharging of the offset capacitor 64 causes the envelope power supply signal EPS to briefly maintain the 4.2 V. However, the offset capacitor 64 discharges at a rate such that the envelope power supply signal EPS cannot be maintained at 4.2 V for the predetermined minimum testing period of 3.0 μs. This is because the control amplifier 70 cannot provide sufficient voltage to maintain the envelope power supply signal EPS at the desired level due to the design constraints discussed above. Accordingly, the envelope power supply signal EPS begins to decrease shortly after time t5, decreasing to 3.0 V by time t8. Therefore, as illustrated by the example in FIG. 6, foregoing the boost signal BOOST as described in FIGS. 4 and 5 prevents the envelope power converter 34 from maintaining the envelope power supply signal EPS at voltages greater than the supply voltage V_SUPP for isogain contour calibration.

Those skilled in the art will recognize improvements and modifications to the embodiments of the present disclosure. All such improvements and modifications are considered within the scope of the concepts disclosed herein and the claims that follow.

What is claimed is:

1. An envelope power converter comprising:
 a switching power converter configured to receive a supply voltage and provide an output voltage based on a switching control signal;
 a holding inductor coupled between the switching power converter and an envelope power supply output node;
 an offset capacitor coupled between the envelope power supply output node and a control node; and
 a control circuit coupled to the switching power converter and the control node, the control circuit configured to:
  in response to a target envelope power supply output voltage, generate the switching control signal and a control voltage at the control node so as to maintain a voltage of an envelope power supply signal at the envelope power supply output node at the target envelope power supply output voltage; and
  in response to a boost signal, generate the switching control signal and the control voltage such that the supply voltage is provided by the switching power converter directly to the holding inductor and the offset capacitor is charged to a target capacitor voltage level without changing the voltage of the envelope power supply signal.

2. The envelope power converter of claim 1 wherein:
 in a normal mode of operation, the boost signal is not provided to the control circuit; and
 in a boost mode of operation, the boost signal is provided to the control circuit for a predetermined charging period before the target envelope power supply output voltage is provided to the control circuit such that the offset capacitor is charged to the target capacitor voltage level.

3. The envelope power converter of claim 2 wherein the target capacitor voltage level is sufficient to allow the envelope power converter to maintain the envelope power supply signal above the supply voltage at a maximum envelope power supply voltage level for a predetermined minimum testing period.

4. The envelope power converter of claim 3 wherein:
 the supply voltage is between 3.6 V and 3.8 V;
 the maximum envelope power supply voltage level is between about 4.2 V and 4.6 V;
 the target capacitor voltage level is between about 1.0 V and 3.0 V;
 the predetermined charging period is between about 0.5 μs and 3.0 μs; and
 the predetermined minimum testing period is between about 1.0 μs and 5.0 μs.

5. The envelope power converter of claim 4 wherein the offset capacitor has a value between 220 nF and 4700 nF.

6. The envelope power converter of claim 5 wherein the holding inductor has a value between 1.0 μH and 4.0 μH.

7. The envelope power converter of claim 1 wherein the switching power converter comprises a step-down only power converter.

8. The envelope power converter of claim 1 wherein the control circuit comprises:
   a control amplifier configured to receive the target envelope power supply output voltage and provide the control voltage to the control node; and
   a switching control circuit configured to generate the switching control signal based on the control voltage and the boost signal.

9. The envelope power converter of claim 8 wherein the control circuit further comprises a supply voltage converter configured to receive the supply voltage and provide a converted supply voltage to the control amplifier.

10. A radio frequency (RF) transmitter comprising:
   a modulator circuit configured to receive a baseband signal and provide an RF input signal;
   an amplifier configured to receive and amplify the RF input signal using an envelope power supply signal to provide an RF output signal;
   a front end circuit configured to receive the RF output signal and provide the RF output signal to an antenna for transmission;
   an envelope power converter comprising:
      a switching power converter configured to receive a supply voltage and provide an output voltage based on a switching control signal;
      a holding inductor coupled between the switching power converter and an envelope power supply output node;
      an offset capacitor coupled between the envelope power supply output node and a control node; and
      a control circuit coupled to the switching power converter and the control node, the control circuit configured to:
         in response to a target envelope power supply output voltage, generate the switching control signal and a control voltage at the control node so as to maintain a voltage of the envelope power supply signal at the envelope power supply output node at the target envelope power supply output voltage; and
         in response to a boost signal, generate the switching control signal and the control voltage such that the supply voltage is provided by the switching power converter directly to the holding inductor and the offset capacitor is charged to a target capacitor voltage level without changing the voltage of the envelope power supply signal; and
      an envelope tracking circuit coupled to the envelope power converter and configured to provide the target envelope power supply output voltage.

11. The RF transmitter of claim 10 wherein the envelope tracking circuit comprises a gain-shaping look-up table configured to receive an envelope tracking signal and provide the target envelope power supply output voltage.

12. The RF transmitter of claim 11 wherein the envelope tracking circuit further comprises an envelope detection circuit configured to detect an envelope of an input signal to the amplifier to provide the envelope tracking signal.

13. The RF transmitter of claim 10 wherein:
   in a normal mode of operation, the boost signal is not provided to the control circuit; and
   in a boost mode of operation, the boost signal is provided to the control circuit for a predetermined charging period before target envelope power supply output voltage is provided to the control circuit such that the offset capacitor is charged to the target capacitor voltage level.

14. The RF transmitter of claim 13 wherein the target capacitor voltage level is sufficient to allow the envelope power converter to maintain the envelope power supply signal above the supply voltage at a maximum envelope power supply voltage level for a predetermined minimum testing period.

15. The RF transmitter of claim 14 wherein:
   the supply voltage is between 3.6 V and 3.8 V;
   the maximum envelope power supply voltage level is between about 4.2 V and 4.6V;
   the target capacitor voltage level is between about 1.0 V and 3.0 V;
   the predetermined charging period is between about 0.5 μs and 3.0 μs; and
   the predetermined minimum testing period is between about 1.0 μs and 5.0 μs.

16. The RF transmitter of claim 15 wherein the offset capacitor has a value between 220 nF and 4700 nF.

17. The RF transmitter of claim 16 wherein the holding inductor has a value between 1.0 μH and 4.0 μH.

18. The RF transmitter of claim 10 wherein the switching power converter comprises a step-down only power converter.

19. The RF transmitter of claim 10 wherein the control circuit comprises:
   a control amplifier configured to receive the target envelope power supply output voltage and provide the control voltage to the control node; and
   a switching control circuit configured to generate the switching control signal based on the control voltage and the boost signal.

20. The RF transmitter of claim 19 wherein the control circuit further comprises a supply voltage converter configured to receive the supply voltage and provide a converted supply voltage to the control amplifier.

* * * * *